United States Patent
Noda

(10) Patent No.: US 7,934,142 B2
(45) Date of Patent: Apr. 26, 2011

(54) ENCODING METHOD TO QC CODE

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 1149 days.

(21) Appl. No.: 11/526,391

(22) Filed: Sep. 25, 2006

(65) Prior Publication Data

US 2007/0094582 A1    Apr. 26, 2007

(30) Foreign Application Priority Data

Oct. 7, 2005   (JP) ................................ P2005-295638
Feb. 9, 2006   (JP) ................................ P2006-032959

(51) Int. Cl.
*H03M 13/00* (2006.01)

(52) U.S. Cl. .................... 714/758; 714/752; 714/801

(58) Field of Classification Search ................ 714/752, 714/755, 801, 777, 781, 746
See application file for complete search history.

(56) References Cited

U.S. PATENT DOCUMENTS

| | | | |
|---|---|---|---|
| 3,475,724 A | 10/1969 | Townsend et al. | |
| 6,928,602 B2 | 8/2005 | Yamagishi et al. | |
| 7,325,183 B2 * | 1/2008 | Deolalikar | 714/777 |
| 7,543,212 B2 * | 6/2009 | Miles et al. | 714/752 |
| 2004/0093549 A1 | 5/2004 | Song et al. | |

FOREIGN PATENT DOCUMENTS

JP    2004-072130    4/2004

* cited by examiner

*Primary Examiner* — Fritz Alphonse
(74) *Attorney, Agent, or Firm* — Robert J. Depke; Rockey, Depke & Lyons, LLC

(57) ABSTRACT

In an encoding and/or decoding method utilizing a self-orthogonal Quasi-Cyclic (QC) code whose parity check matrix is expressed by at least one circulant matrix, a code sequence is generated which satisfies a check matrix. The check matrix is designed so that a column weight w of each circulant matrix is three or larger and a minimum hamming distance of the code is w+2 or larger.

12 Claims, 7 Drawing Sheets

| p | m | n | $N_c$ | $N_o$ | $N_e$ |
|---|---|---|---|---|---|
| 1 | 7 | 7 | 2 | 2 | 0 |
| 1 | 12 | 12 | 2 | 2 | 2 |
| 2 | 13 | 26 | 16 | 4 | 0 |
| 2 | 14 | 28 | 14 | 0 | 0 |
| 2 | 15 | 30 | 24 | 28 | 18 |
| 3 | 19 | 57 | 42 | 32 | 8 |
| 4 | 25 | 100 | 80 | 240 | 60 |
| 5 | 31 | 155 | 130 | 2048 | 370 |
| 6 | 37 | 222 | 192 | 28480 | 5556 |

FIG. 5

| p | m | n | $N_c$ | $N_o$ | $N_e$ |
|---|---|---|---|---|---|
| 1 | 13 | 13 | 4 | 4 | 4 |
| 2 | 25 | 50 | 220 | 0 | 0 |
| 2 | 25 | 52 | 188 | 2 | 2 |
| 3 | 37 | 111 | 1092 | 12 | 12 |
| 4 | 49 | 196 | 3038 | 500 | 486 |

FIG. 6

| | COMPARISON EXAMPLE 1 (PG: w=3, m=127) | COMPARISON EXAMPLE 2 (EG: w=4, m=255) |
|---|---|---|
| $S_0$ | {0, 1, 7} | {0, 1, 72, 126} |
| $S_1$ | {0, 2, 14} | {0, 2, 144, 252} |
| $S_2$ | {0, 3, 63} | {0, 4, 33, 249} |
| $S_3$ | {0, 4, 28} | {0, 7, 49, 104} |
| $S_4$ | {0, 5, 54} | {0, 8, 66, 243} |
| $S_5$ | {0, 8, 56} | {0, 9, 32, 207} |
| $S_6$ | {0, 9, 90} | {0, 11, 81, 199} |
| $S_7$ | {0, 10, 108} | {0, 13, 38, 224} |
| $S_8$ | {0, 11, 87} | {0, 14, 98, 208} |
| $S_9$ | {0, 13, 55} | {0, 15, 89, 164} |
| $S_{10}$ | {0, 15, 31} | {0, 16, 132, 231} |
| $S_{11}$ | {0, 17, 43} | {0, 17, 51, 119} |
| $S_{12}$ | {0, 18, 53} | {0, 18, 64, 159} |
| $S_{13}$ | {0, 20, 89} | {0, 19, 112, 134} |
| $S_{14}$ | {0, 21, 57} | {0, 21, 124, 176} |
| $S_{15}$ | {0, 22, 47} | {0, 26, 76, 193} |
| $S_{16}$ | {0, 23, 82} | {0, 27, 92, 219} |
| $S_{17}$ | {0, 27, 66} | {0, 28, 161, 196} |
| $S_{18}$ | {0, 30, 62} | {0, 30, 73, 178} |
| $S_{19}$ | {0, 33, 77} | {0, 37, 120, 202} |
| $S_{20}$ | {0, 34, 86} | {0, 41, 86, 195} |

FIG. 7

| | FIRST EMBODIMENT (w=3, m=127) | SECOND EMBODIMENT (w=4, m=255) |
|---|---|---|
| $S_0$ | {0, 1, 15} | {0, 1, 10, 50} |
| $S_1$ | {0, 2, 104} | {0, 2, 55, 133} |
| $S_2$ | {0, 3, 10} | {0, 3, 163, 242} |
| $S_3$ | {0, 4, 107} | {0, 4, 30, 119} |
| $S_4$ | {0, 5, 46} | {0, 5, 93, 132} |
| $S_5$ | {0, 6, 83} | {0, 6, 71, 226} |
| $S_6$ | {0, 8, 51} | {0, 7, 63, 164} |
| $S_7$ | {0, 9, 87} | {0, 8, 181, 193} |
| $S_8$ | {0, 11, 59} | {0, 11, 141, 208} |
| $S_9$ | {0, 12, 65} | {0, 14, 90, 203} |
| $S_{10}$ | {0, 13, 32} | {0, 15, 149, 222} |
| $S_{11}$ | {0, 16, 80} | {0, 17, 38, 156} |
| $S_{12}$ | {0, 17, 52} | {0, 18, 64, 86} |
| $S_{13}$ | {0, 18, 45} | {0, 19, 51, 180} |
| $S_{14}$ | {0, 21, 60} | {0, 20, 43, 214} |
| $S_{15}$ | {0, 22, 58} | {0, 24, 60, 104} |
| $S_{16}$ | {0, 26, 54} | {0, 25, 59, 168} |
| $S_{17}$ | {0, 29, 71} | {0, 27, 135, 172} |
| $S_{18}$ | {0, 30, 96} | {0, 28, 97, 178} |
| $S_{19}$ | {0, 33, 90} | {0, 31, 103, 148} |
| $S_{20}$ | {0, 34, 89} | {0, 42, 144, 201} |

|  | w | m | n | rank | R |
|---|---|---|---|---|---|
| FIRST EMBODIMENT | 3 | 127 | 2667 | 127 | 0.9524 |
| COMPARISON EXAMPLE 1 (PG) | 3 | 127 | 2667 | 120 | 0.9550 |
| SECOND EMBODIMENT | 4 | 255 | 5355 | 254 | 0.9526 |
| COMPARISON EXAMPLE 2 (EG) | 4 | 255 | 5355 | 234 | 0.9563 |

ENCODING METHOD TO QC CODE

CROSS REFERENCE TO RELATED APPLICATION

The present invention contains subject matters related to Japanese Patent Application Nos. JP 2005-295638 and JP 2006-032959 filed in the Japanese Patent Office on Oct. 7, 2005 and Feb. 9, 2006, respectively, the entire contents of which being incorporated herein by reference.

BACKGROUND OF THE INVENTION

1. Field of the Invention

The present invention relates to an encoding method, more particularly to an encoding method to a self-orthogonal quasi-cyclic (QC) code.

2. Description of Related Art

Generally, in the majority of a recording/reproducing apparatus and a communication apparatus, an attempt has been made to reduce a bit-error rate (BER) of digital transmission information by transmitting a code sequence obtained by encoding an input information sequence.

FIG. 1 is a block diagram for showing a common recording/reproducing apparatus or a common communication apparatus in which any digital signal processing is performed.

In FIG. 1, first, an information sequence from a user is input to an encoding section 1a of a recording or transmission device 1. The encoding section 1A encodes the information sequence at a ratio of k/n to provide a code sequence. It is to be noted that k is an information word length, n is a code word length, and k/n is referred to as a code rate or a coding rate. Encoding is often carried out, involving a plurality of encoding schemes such as encryption, error correction coding, and run-length limited coding.

The encoding section 1A transmits the code sequence to a recording section 1B (or a transmission section 1B) of the recording or transmission device 1. In a case of a recording/reproducing system, for example, the recording section 1B receives and records the code sequence as a recorded signal on a recording medium, not shown, by using an optical pickup, a magnetic head, and the like. In a case of a wireless communication system, for example, the transmission section 1B receives and transmits the code sequence as a transmission signal to the air space through a transmission antenna in the transmission section 1B.

The recorded signal or the transmission signal is input to a reproducing section 2A (or a reception section 2A) of a reproducing or reception device 2. In a case of the recording/reproducing system, the reproducing section 2A reads the recorded signal out of the recording medium, not shown, with an analog optical pickup or an analog magnetic head to convert it into an analog reproduced signal. In the case of the wireless communication system, the reception section 2A receives and converts the transmission signal in the air space into an analog reception signal through a reception antenna.

These analog signals are equalized to any predetermined target equalization characteristics by using an analog equalizer, not shown, and then converted into a digital reception signal in an A/D conversion section 2B per time. It is to be noted that the A/D conversion section 2B includes a phase-locked loop circuit, not shown. A code detection section 2C receives the digital reception signal and converts it into a detected code sequence or its posterior probability information sequence. A decoding section 2D receives and decodes the sequences into detected information words at a ratio of n/k, to provide a detected information sequence.

However, if equalization by the analog equalizer is not sufficient, a digital equalizer may be provided between the A/D conversion section 2B and the code detection section 2C in some cases. Further, recently, in the code detection section 2C, generally a soft-decision detector such as a Viterbi detector has been used. In the case where repeated decoding is employed in the decoding section 2D, a posterior probability detector may be used in the code detection section 2C in some cases.

A variety of codes have been discussed as the codes which are used in the encoding section 1A and the decoding section 2D shown in FIG. 1, some of which have been commercialized including a Reed-Solomon (RS) code, etc. Recently, as one of error correction codes which are used in the encoding section 1A and the decoding section 2D of FIG. 1 to reduce a BER of transmission information effectively, a low-density parity-check (LDPC) code has been studied greatly. The LDPC code has long been known since it was proposed by R. G. Gallager in 1961. Recently, it has become clear that the LDPC code has a very excellent decoding performance. Details of the LDPC code are disclosed in a literature, "Low Density Parity Check Codes," by R. G. Gallager, MIT Press, Cambridge, Mass., 1963.

This LDPC code refers to a parity-check code in which its parity-check matrix (hereinafter referred to as "check matrix" simply) has a sparse number of is. Therefore, the LDPC code is a name that is applicable to a very wide range of such codes that the number of 1s in their check matrix is just defined ambiguously to some extent. Therefore, it does not refer to a code that complies with specific code generation rules like an RS code generally well known, for example. That is, there are very many so-called LDPC codes that have the same code word length or parity length. To decode LDPC codes, generally, one of repeated decoding methods referred to as a sum-product decoding method or a belief-propagation (BP) decoding method is applied.

To obtain a good BER when the BP decoding method is applied to the LDPC codes, it is preferable that its check matrix should have as few short cycles as possible. The smallest number of cycles in a matrix is four. Therefore, to reduce a post-decoding BER for LDPC codes, it is known that its check matrix preferably includes no four-cycles. Here, terms, "a binary matrix whose element is {0, 1} has a four-cycle" means that when arbitrary two columns are selected in a matrix, at least two row in which both of the two columns have 1 are present.

If a check matrix of a code has no four-cycle, this code is referred to as "a self-orthogonal code". In many cases, in the self-orthogonal code, resultantly its check matrix has a sparse number of is, so that this code can be utilized as an LDPC code. Further, it is known that the self-orthogonal code is one-step majority-logic decodable. Supposing a minimum column weight in a check matrix to be w, it is known that a minimum hamming distance (hereinafter referred to as "minimum distance") $d_{min}$ of a self-orthogonal code is given by the following Equation (1). It is to be noted that a column weight refers to a total number of is in a column in a case of a binary matrix.

$$d_{min} \geq w+1 \qquad (1)$$

Further, an upper limit of a code word length n of a self-orthogonal code having a check matrix with a constant column weight is known as a Steiner limit and given by the following Equation (2) using w and the number of rows m of the check matrix.

$$n \leq \frac{m(m-1)}{w(w-1)} \quad (2)$$

In the LDPC code, generally, to reduce a post-decoding BER, preferably the minimum distance of the code is as large as possible, while to reduce a circuit scale of the decoder, preferably the column weight is as small as possible. However, in many cases, an increase in minimum distance leads to an increase in column weight, thereby resulting in complexity of the decoder. That is, in the LDPC code, if a post-decoding BER is improved, such the improvement is liable to lead to an increase in circuit scale of the relevant encoder and decoder.

Recently, as one method for solving this, it has been focused that a time-honored quasi-cyclic (QC) code is used as an LDPC code. This QC code has a very high regularity of a check matrix, so that by utilizing this regularity, the QC code, when used as the LDPC code, is expected to reduce a circuit scale of the relevant encoder and decoder. It is to be noted that a QC code refers to such a code that a sequence obtained by cyclically shifting an arbitrary code word by a certain period p different from a length of the code word may provide a code word other than the original code word. A QC code, if p=1 is established in particular, is referred to as "a cyclic code". It is also possible to make the QC code self-orthogonal (see a literature, "Self-Orthogonal Quasi-Cyclic Codes" by R. Townsend and E. Weldon, Jr., IEEE Trans. Info. Theory, vol. IT-13, no. 2, pp. 183-195, April 1967).

A check matrix of the QC code can be expressed using a p's integral multiple of circulant matrices. Generally, a circulant matrix composed of m number of rows and m number of columns (m-by-m circulant matrix) is defined as such a matrix that every column of it can be obtained by cyclically shifting an arbitrary column, for example, a first column. That is, if a leftmost first column vector of an m-by-m circulant matrix C is defined as $[x_0, x_1, \ldots, x_{m-1}]^T$ (T indicates transposition operation), C is expressed as follows.

$$C = \begin{pmatrix} x0 & x_{m-1} & x_{m-2} & \cdots & x1 \\ x1 & x0 & x_{m-1} & \cdots & x2 \\ x2 & x1 & x0 & \cdots & x3 \\ \vdots & \vdots & \vdots & \ddots & \vdots \\ x_{m-1} & x_{m-2} & x_{m-3} & \cdots & x0 \end{pmatrix} \quad (3)$$

However, although each of the columns of the circulant matrix C is circulated downward in the Equation (3), they may be circulated upward in definition. An inverse matrix of a circulant matrix and a product of two circulant matrices provide a circulant matrix.

In this case, if an m-by-p matrix Di (0≦i<m) is defined as a matrix whose j'th column (0≦j<p) is composed of the i'th columns of p number of m-by-m circulant matrices Cj, one of check matrices Hp of a QC code having a period p can be expressed as follows:

$$Hp = (D0\,D1 \ldots D_{m-1}) \quad (4)$$

Using a very simple shift register circuit enables any information to be encoded as the QC code (see a literature, "Self-Orthogonal Quasi-Cyclic Codes," by R. Townsend and E. Weldon, Jr., IEEE Trans. Info. Theory, vol. IT-13, no. 2, pp. 183-195, April 1967 and U.S. Pat. Nos. 3,475,724 and 6,928,602.

So far, several theories for designing a QC code that is available as an LDPC code have been known. As one of the theories, finite geometry has been known. This finite geometry may mainly come in Euclidean geometry (EG) and projective geometry (PG). A code designed in accordance with the finite geometry is referred to as a finite geometry code.

A check matrix of the finite geometry matrix code is composed on the basis of points that are present on lines in a space, so that the finite geometry matrix code is defined as 1 if points are present and as 0 otherwise. Considering $GF(2^{qs})$ that has a Galois field GF $(2^s)$ as a subspace, m-dimensional Euclidean geometry on the Galois field GF $(2^s)$ having $2^s$ number of points on one line is expressed as EG (q, $2^s$). Further, considering GF $(2^{(q+1)s})$ that has a Galois field GF $(2^s)$ as a subspace, q-dimensional projective geometry having $2^s+1$ number of points on one line is expressed as PG (q, $2^s$).

A finite geometry code has been known for long as a majority-logic decodable circulant code; for example, a (272, 190) shortened difference set circulant code obtained by shortening by one bit a (273, 191) difference set circulant code based on a projective geometry PG (2, $2^4$) has been realized as an error correction code for use in multiplex telecasting in Japan. It is to be noted that n of an (n, k) code indicates a code word length and k thereof indicates an information word length. Although finite geometry codes include a code that is majority-logic decodable at two stages or more, such the codes are not self-orthogonal. A method for using a self-orthogonal finite geometry code as an LDPC code is disclosed in a literature, "Low Density Parity Check Codes on Finite Geometries: A Rediscovery and New Results," by Y. Kou, S. Lin and M. Fossorier, IEEE Trans. Info. Theory, vol. 47, no. 7, pp. 2711-2735, November 2001.

In this literature, a code that has a transposed matrix of a check matrix of a finite geometry code as its check matrix is referred to as "a type-II code of finite geometry codes" and the fact that some of such type-II codes are useful as an LDPC code is pointed out. It is be noted that a finite geometry code becomes a circulant code and its type-II code becomes a QC code and further a type-II code of self-orthogonal finite geometry codes is self-orthogonal. Hereinafter, a finite geometry code and its type-II code are each referred to as "a code based on finite geometry".

In self-orthogonal QC codes based on the finite geometry, if p≧2, generally, a relationship of $d_{min}=w+1$ is established. However, if a binary code is given, whether its minimum distance is not larger than a certain hamming distance $d_H$ or not can be checked as follows. That is, when $d_H$ number (s) of columns is (are) extracted from a check matrix, it is enough only to give only one example of such a combination that modulo2 of a total number of 1s in each of the rows may be 0 in all rows. Further, in this case, if $d_H=w+1$ and the code is self-orthogonal, its minimum distance can be determined to be w+1 from the Equation (1).

As another theory that is available to a design of a QC code, for example, a time-honored method based on combinatorics referred to as balanced incomplete block design (BIBD) has been known. A method for configuring an LDPC code according to the BIBD is disclosed in a literature, "Construction of Low-Density Parity-Check Codes Based on Balanced Incomplete Block Designs," by B. Ammar, B. Honary, Y. Kou, J. Xu and S. Lin, IEEE Trans. Info. Theory, vol. 50, no. 6, pp. 1257-1268, June 2004. However, projective geometry classified into an infinite family is one of the BIBD approaches.

A code configured in accordance with BIBD includes a QC code partially but is not whole of the QC code.

Discussion to make a minimum distance of a self-orthogonal code not limited to a QC code configured in accordance with the BIBD larger than w+1 has been often carried out so far in the case of w=3. It is known that if all of columns of a check matrix have the same weight and w=3, by removing all code words that constitute hamming distance 4 from a self-orthogonal code, its minimum distance becomes at least 6. A configuration of a check matrix of such a code is referred to as "an anti-Pasch configuration".

In combinatorics, a Pasch configuration is referred to also as a quadrilateral and refers to such a configuration that a union of four triple-points of a Steiner triple system is constituted of a set of six points. In other words, the Pasch configuration means that the four triple-points are give in formats of {x0, x1, x2}, {x0, x4, x5}, {x1, x3, x5}, and {x2, x3, x4}. An STS including no Pasch configuration is referred to as an anti-Pasch configuration or a quadrilateral-free configuration. Details of the anti-Pasch configuration are disclosed in a literature, "Anti-Pashe Steiner Triple Systems," by T. S. Griggs, J. Murphy and J. S. Phelan, J. of Combinatories, Information & System Sciences, vol. 15, pp. 79-84, 1990.

I, however, believe that no QC code that has an anti-Pasch configuration with w=3 in a check matrix in the Equation (4) has yet been reported. Further, in a self-orthogonal code based on the finite geometry or the BIBD, the code word length and the number of parity bits of a code that can be designed are restrictive.

A report has been made so far of a self-orthogonal QC code which is designed with arbitrary code word length and number of parity bits without using any finite geometry or BIBD and whose minimum distance is larger than w+1, that is, which has an established relationship given by:

$$d_{min} \geq w+2 \quad (5)$$

in a case where w=2, for example (see United States Patent Application Publication No. US2004/0093549.

A QC code has been known to surely include six cycles if w≧3; however, the six-cycles can be removed therefrom only if w=2. If four-cycles and six-cycles are removed from a QC code with w=2, its minimum distance becomes at least four. A method of the above US Patent Application Publication has disclosed a design of a code that satisfies the above Equation (5) by utilizing such a peculiarity that six-cycles can be removed only if w=2.

Thus, it has been known that a self-orthogonal QC code is effectively available to any use as one method for simplifying an encoding/decoding circuit for an LDPC code, and the finite geometry and the BIBD are representative theories for designing the self-orthogonal QC code.

SUMMARY OF THE INVENTION

However, as for a code based on the finite geometry or the BIBD, as described above, its code word length and the number of its parity bits have been limited to very few values. Therefore, if applying this code to an actual system, the code word length and the number of parity bits of data to be handled are limited, thus resulting in a difficulty in application.

Further, to improve a post-decoding BER of a code, an improvement in minimum distance $d_{min}$ of the code is considered to be one of effective methods. A hitherto known self-orthogonal QC code, however, has a relationship of $d_{min}$=w+1 in many cases. As for a self-orthogonal QC code that has a relationship of $d_{min} \geq w+2$ with arbitrary code word length and number of parity bits, a code configuration method for removing six-cycles from its check matrix is available in the case of w=2 but not available in the case of w≧3. Because of the configuration, it has been difficult to find out a general-purpose method for establishing a relationship of $d_{min} \geq w+2$, that is, the above-described Equation (5) for a QC code with w≧3 which includes a six-cycle in principle.

It is desirable to provide an encoding method to QC code as such the general-purpose method for establishing the above relationship to reduce a bit error rate (BER) and an undetected error probability of transmission information.

According to an embodiment of the invention, there is provided an encoding method to a self-orthogonal QC code whose parity check matrix is expressed by at least one circulant matrix wherein a code sequence is generated which satisfies a check matrix, the check matrix being designed in which a column weight w of each circulant matrix is three or larger and a minimum hamming distance of the code is w+2 or larger.

According to another embodiment of the invention, there is provided an encoding method to a self-orthogonal QC code whose parity check matrix is expressed by at least one circulant matrix. In this method, supposing a period of the QC code to be p, number of rows of the check matrix to be m, and one permutation of each element of a j'th (0≦j≦w) address set among w+1 number of address sets redundantly extracted from p number of addresses which has w as the number of elements and which represent a structure of p number of the circulant matrices that constitute the check matrix to be $b_{0,j}$, $b_{1,j}, \ldots, b_{w-1, j}$, a relationship of $b_{j-1,0} - b_{i-1,0} + b_{0,i} - b_{j-1, i} + b_{i, j} - b_{0, j}$ (mod m) is established for all permutations of $b_{0,j}$ $b_{1,j}, \ldots, b_{w-1,j}$ about one [ij] within a range of 2≦j≦w and 1≦i<j.

Thus, according to the embodiments of the present invention, in a case of an LDCP code with w≧3, it is possible to give a code regularity associated with a reduction in circuit scale of the encoder/decoder and improve a decoding performance through an increase in minimum distance simultaneously.

Particularly, according to the embodiments of the present invention, it is possible to use as an LDPC code a code in which its minimum distance is increased in an arbitrary p, an arbitrary column weight and an arbitrary number of columns of check matrix for an encoding method to a self-orthogonal QC code whose parity check matrix is constituted of p number of circulant matrices. This enables the post-decoded BER and the undetected error probability of transmission information to be improved. If the encoding method according to the embodiments of this invention is applied to a communication system and/or a storage system, it is possible to improve reliability in these systems.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIG. 5 is a table for showing results of checking, by the total retrieval method, m, p, n, Nc, No, and Ne as in the case of FIG. 4 when w=4 and p≦4 according to the algorithm of FIG. 3;

FIG. 6 is a table for showing 21 BASs used in two comparative examples;

FIG. 7 is a table for showing 21 BASs obtained by the partial search methods according to two embodiments of the present invention;

DESCRIPTION OF THE PREFERRED EMBODIMENTS

Figure 1:
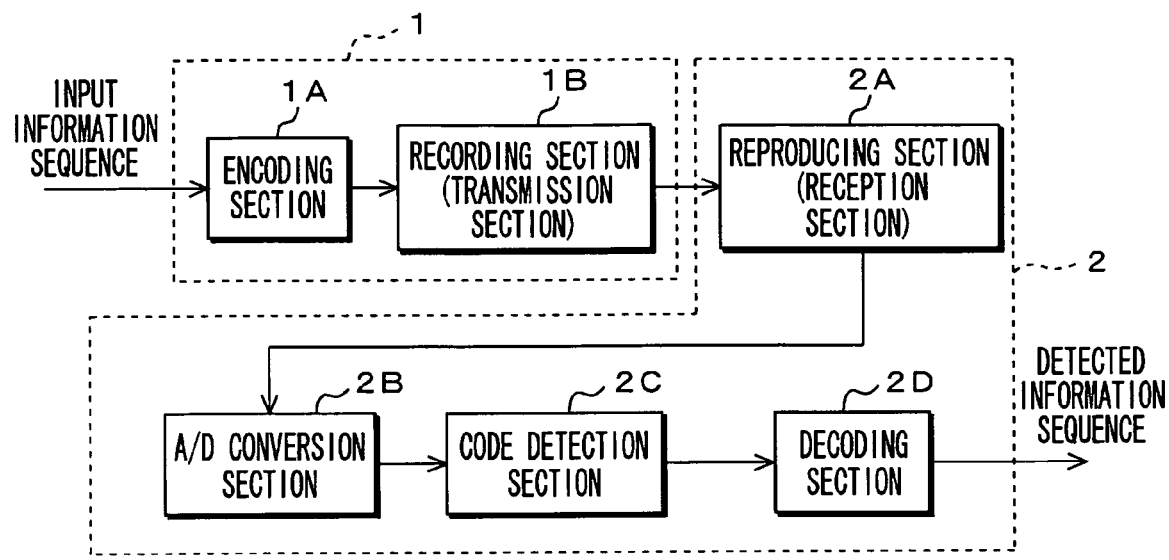
FIG. 1 is a block diagram for showing a typical recording/reproducing apparatus or communication apparatus according to related art.

The following will describe embodiments of the present invention.

First, a method will be described for expressing a circulant matrix that constitutes a QC matrix according to an embodiment of the present invention.

Suppose here a set of w number of row addresses having bit 1 in the j'th column ($0 \leq j < m$) in an m-by-m binary circulant matrix whose every column has the same weight of w to be $A_j$. For example, if $A_0\{2, 3, 5\}$ is given, the corresponding circulant matrix C with m=7 is expressed as follows:

$$C = \begin{bmatrix} 0 & 0 & 1 & 0 & 1 & 1 & 0 \\ 0 & 0 & 0 & 1 & 0 & 1 & 1 \\ 1 & 0 & 0 & 0 & 1 & 0 & 1 \\ 1 & 1 & 0 & 0 & 0 & 1 & 0 \\ 0 & 1 & 1 & 0 & 0 & 0 & 1 \\ 1 & 0 & 1 & 1 & 0 & 0 & 0 \\ 0 & 1 & 0 & 1 & 1 & 0 & 0 \end{bmatrix} \quad (6)$$

This definition of Aj is the same as that of a block in BIBD.

In this case, among a possible sequence $a_0 a_1, \ldots, a_{w-1}$ in which all elements of Aj are arranged in an ascending size order in a binary circulant matrix including no four-cycle, only one Aj surely exists which satisfies the following two conditions.

$$a_0 = 0 \quad (7)$$

$$a_1 < ai - a_{i-1} \quad (8)$$

where $2 \leq j \leq w$ and $a_w \equiv m$ and the Equation (8) is supposed to hold true for all values of i within this range. For example, in an example of the Equation (6), only $A_5 = \{0, 1, 3\}$ satisfies the Equations (7) and (8). However, the Equation (8) includes a condition for $a_1 \neq a_i - a_{i-1}$, which is one of conditions of a circulant matrix including no four-cycle.

In the present embodiment, Aj that satisfies the Equations (7) and (8) is referred to as "a base address set (BAS)", and a circulant matrix obtained by cyclically shifting rows and columns of an original circulant matrix is regarded as being equivalent to this original circulant matrix. In this case, one BAS can express one independent circulant matrix, that is, m number of equivalent circulant matrices. Further, similarly, p number of different BASs can express an m-by-(m*p) QC matrix constituted of p number of independent circulant matrices. It is supposed that QC matrices used in the present embodiment of the invention can be expressed in accordance with the Equation (4).

The following will describe p number of BAS conditions which make a QC code used in the present embodiment a self-orthogonal code, that is, remove four-cycles from a check matrix.

Consider an m-by-2 sub-matrix obtained by subtracting arbitrary two columns from an arbitrary m-by-n check matrix not limited to that of a QC code. Further consider a 2-by-2 sub-matrix obtained by extracting arbitrary two columns from that m-by-2 sub-matrix. The m-by-n check matrix includes a four-cycle when there exists at least one 2-by-2 sub-matrix whose elements are all 1. Therefore, to give a check matrix having no four-cycle, it may design such a check matrix that no element of all 1 may exist in all the 2-by-2 sub-matrices extracted arbitrarily from an m-by-n check matrix.

I study that by utilizing a QC structure of a check matrix, such a check matrix can be efficiently designed for an arbitrary value of w as described below.

Suppose here that arbitrary r number ($1 \leq r$) of BASs extracted redundantly from p number of BASs $S_0, S_1, \ldots,$ and $S_{p-1}$ that define a check matrix of a QC code to be $T_0, T_1, \ldots,$ and $T_{r-1}$. It is here supposed that $T_j \equiv \{a_{0,j}, a_{1,j}, \ldots a_{w-1,j}\}$, where $a_{0,j} = 0$ and $0 \leq j < r$.

In this case, a check matrix of a QC code encounters no four-cycle in such condition that the following equation may hold true on arbitrary two BASs of $T_0$ and $T_1$ extracted redundantly from $S_0, S_1, \ldots,$ and $S_{p-1}$.

$$a_{i0,0} - a_{i1,0} + a_{i2,1} - a_{i3,1} \neq 0 \pmod{m} \quad (9)$$

In this case, if $T_0 \neq T_1$, relationships of $1 \leq i_0 \leq w$, $0 \leq i_1 \leq i_0$, $0 \leq i_2 \leq w$, and $0 \leq i_2 \leq w$ ($i_3 \neq i_2$) are established, and if $T_0 = T_1$, relationships of $2 \leq i_0 \leq w$, $0 \leq i_1 \leq i_0$, and $i_0 \leq i_2 \leq w$ ($i_1 \leq i_3 < i_0$ and $i_2 \leq i_3 \leq w$) are established, so that the Equation (9) holds true on all integers of $i_0, i_1, i_2,$ and $i_3$.

If $T_0 \neq T_1$, for some values of $T_0$ and $T_1$, a maximum value of a total number of evaluation times by the Equation (9) takes on the following value $n_0$.

$$n_0 = \sum_{i0=1}^{w-1} \sum_{i1=0}^{i0-1} \sum_{i2=0}^{w-1} (w-1) = \frac{\{(w-1)w\}^2}{2} \quad (10)$$

For example, if w=2, $n_0$=2; if w=3, $n_0$=18; and if w=4, $n_0$=72.

If $T_0=T_1$, that is, $T_0$ and $T_1$ are composed of one BAS, the maximum value of the total number of evaluation times by the Equation (9) takes on the following value $n_1$.

$$n_1 = \sum_{i0=2}^{w-1} \sum_{i1=0}^{i0-1} \sum_{i2=i0}^{w-1} \{(i_0 - i_1) + (w - i_2 - 1)\} = \frac{w(w-1)(w-2)(w+3)}{12} \quad (11)$$

For example, if w=2, $n_1$=0; if w=3, $n_1$=3; and if w=4, $n_1$=14. However, for certain values of $T_0$ and $T_1$, it is only when $T_0$ and $T_1$ satisfy the Equation (9) to check the Equation (9) on all $n_0$ or $n_1$ number of combinations thereof.

If any one of combinations of $T_0$ and $T_1$ does not satisfy the Equation (9), the corresponding BAS combination that generates such $T_0$ and $T_1$ is not employed as the p number of BASs that express a check matrix in the embodiment of the present invention. As far as $T_0$ and $T_1$ satisfy the Equation (9), there is a need to evaluate the Equation (9) sequentially about all values of $T_0$ and $T_1$ that can be extracted from the p number of BASs. The number, $n_2$, of the combination for extracting two BASs, $T_0$, $T_1$ redundantly from the p number of BASs can be calculated by the following equation.

$$N_2 = \frac{p(p+1)}{2} \quad (12)$$

For example, if p=21, $n_2$=231. However, it is only when all the BASs, $T_0$, $T_1$ extracted redundantly from the p number of BASs satisfy the Equation (9) to need to check the Equation (9) on all the $n_2$ number of combinations.

Hereinafter, it is supposed that p number of BASs used in the embodiments of the present invention satisfy the Equation (9), that is, QC code used in the embodiments of the present invention is a self-orthogonal code.

The following will describe such conditions of the p number of BASs that a minimum distance of a self-orthogonal QC code used in the embodiment of the present invention may be w+2 or larger.

Consider an m-by-(w+1) sub-matrix obtained by extracting arbitrary w+1 number of columns from an m-by-n check matrix, which is not limited to a check matrix of a QC code. The minimum distance of a code that has this sub-matrix as a part of the check matrix becomes equal to w+1 when each modulo0 that is a total number of is in each of the rows in the m-by-(w+1) sub-matrix is 0. However, when each modulo0 of the total number of 1s in each of the rows of the m-by-(w+1) sub-matrix is 0 and if the total number of is is four or larger in any one of the rows, it means that a four-cycle occurs in this sub-matrix, that is, this code is not self-orthogonal. Therefore, when the maximum distance of a self-orthogonal code is w+1 and if a row whose elements are all 0 is all removed from a certain m-by-(w+1) sub-matrix, which is a part of a check matrix thereof, there exists a u-by-(w+1) sub-matrix in which the total number of 1s is 2 in all rows. In this case, u is given by the following equation.

$$u \equiv \frac{w(w+1)}{2} \quad (13)$$

For example, if w=2, U=3; if w=3, U=6; and if w=4, U=10.

Figure 2:
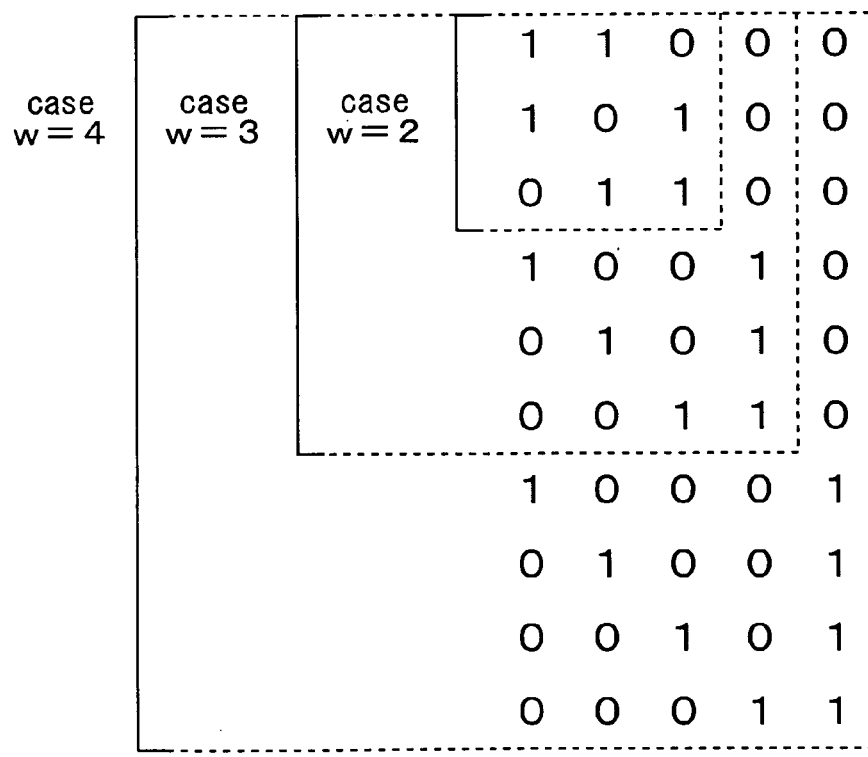
FIG. 2 is a drawing for showing one example of a u-by-(w+1) sub-matrix in which a total number of 1s in every row is two in a case of w≦4.

FIG. 2 shows one example of a u-by-(w+1) sub-matrix in which a total number of is is two in all rows in a case of w≦4.

In FIG. 2, the total number of is is 2 in all rows of the n-by-(w+1) sub-matrix, that is, modulo2 of the total number of 1s is 0 in all rows, so that the minimum distance of a self-orthogonal code that has such a sub-matrix as a part of a check matrix is w+1.

Therefore, to obtain a self-orthogonal code whose minimum distance becomes w+2 or larger, it may design such a check matrix that the total number of 1s is 2 does not exist in each row thereof in all u-by-(w+1) sub-matrices that can be extracted from m-by-n check matrices. I study that by utilizing a QC structure of a check matrix, such a check matrix can be efficiently designed for an arbitrary value of w as described below.

Suppose here that w+1 number of BASs arbitrarily extracted redundantly from p number of BASs $S_0, S_1, \ldots,$ and $S_{p-1}$ to be $T_0, T_1, \ldots,$ and $T_w$. Further, arbitrary permutations of $T_0, T_1, \ldots,$ and $T_w$ are supposed to be $U_0, U_1, \ldots, U_w$ and permutations of elements in $U_j$ (0≦j≦w) to be $b_{0,j}, b_{1,j}, \ldots, b_{w-1,j}$. However, if $U_x=U_y$ (1≦x≦w and 0≦y<x), $b_{x,y} \neq b_{x-1,y}$.

In this case, if all permutations of all elements of $U_0, U_1, \ldots, U_w$ obtained from $S_0, S_1, \ldots,$ and $S_{p-1}$ satisfy the following Equation (14), the minimum distance of that QC code is w+2 or larger.

$$b_{j-1,0} - b_{i-1,0} + b_{0,i} - b_{j-1,i} + b_{i,j} - b_{0,j} \not\equiv 0 \pmod{m} \quad (14)$$

Here, 2≦j≦w and 1≦i<j, so that the Equation (14) may be satisfied on one [ij] in certain one permutation of elements of $U_0, U_1, \ldots, U_w$. However, in this case, a BAS of any one of $T_0, T_1, \ldots,$ and $T_w$ need not take into account both permutations of the BASs themselves and permutations of their elements. For example, in calculation of the Equation (14), only as $T_0$, an arbitrary one of these permutations may be used, so that for the other elements of $T_1, \ldots,$ and $T_w$, these permutations all need to be checked. However, in this case, even if the Equation (14) has been evaluated on all of the permutations of $T_0, T_1, \ldots,$ and $T_w$, some of the evaluations may be redundant to take longer calculation time, thereby having no influence on performance of codes used in the embodiment of the present invention. Hereinafter, permutations are not taken into account only for $T_0$. However, in this case, a method for taking into account a permutation of elements for all BASs by supposing that $U_0=T_0, U_1=T_1, \ldots,$ and $U_w=T_w$ without taking into account the permutations of the BASs themselves temporarily is essentially the same method of the present embodiment.

The maximum value of a total number of times of evaluating the Equation (14) is the following value of $n_3$ for certain one of the elements of one permutation $U_0, U_1, \ldots, U_w$.

$$n_3 = \sum_{k=2}^{w} (k-1) = \frac{(w-1)w}{2} \quad (15)$$

For example, if w=2, $n_3$=1; if w=3, $n_3$=3; and if w=4, $n_3$=6. However, it is only when that permutation does not satisfy the Equation (14) that the Equation (14) necessary to be checked for all $n_3$ number of combinations of the permutations of the elements of one permutation $U_0, U_1, \ldots, U_w$.

If any one permutation $U_0, U_1, \ldots, U_w$ does not satisfy the Equation (14), a combination of BASs that generate the permutation is not used in p number of BASs that express a check matrix relative to any embodiment of the present invention. As far as $U_0, U_1, \ldots, U_w$ satisfies the Equation (14), needed is sequential evaluation on a predetermined number of permutations $((w!)^w$ at the maximum) of the elements of $U_0, U_1, \ldots, U_w$ and all permutations (w! at the maximum) of $T_1, T_2, \ldots,$ and $T_w$. That is, for one combination of $T_1, T_2, \ldots,$ and $T_w$, the maximum value of the total number of times of evaluating the Equation (14) is the following value of $n_4$.

$$n_4 = (w!)^{w+1} \tag{16}$$

For example, if w=2, $n_4$=8; if w=3, $n_4$=1296; and if w=4, $n_4$=7962624. However, it is only when $T_0, T_1, \ldots,$ and $T_w$ are all different and all of their permutations $U_0, U_1, \ldots, U_w$ satisfy the Equation (14) that the Equation (14) needs to be checked for all $n_4$ number of permutations.

Further, the number, $n_5$, of combinations of w+1 number of BASs of $T_1, T_2, \ldots,$ and $T_w$ from p number of BASs redundantly up to w+1 number of them is calculated by the following equation:

$$n_5 = \frac{(p+w)!}{\{(p-1)!\} \cdot \{(w+1)!\}} \tag{17}$$

For example, in the case of p=21, if w=2, $n_5$=1771; if w=3, $n_5$=10626; and if w=4, $n_5$=53130. However, it is only when all of $T_0, T_1, \ldots,$ and $T_w$ extracted redundantly from p number of BASs satisfy the Equation (14) that the Equation (14) needs to be checked for all of $n_5$ number of permutations.

In this case, if the extracted w+1 number of BASs are all the same, that is, if $T_w =, \ldots, T_1 = T_0 = \{a_0, a_1, \ldots, a_{w-1}\}$ where $a_0 = 0$, such a BAS as to satisfy the Equation (14) has a more simplified necessary and sufficient condition. This condition is that the following two equations both hold true for a certain value of x if m is a multiple of $2^w - 1$.

$$a_x \neq \frac{(2^x - 1) \cdot m}{2^w - 1} \tag{18.1}$$

$$a_x \neq \frac{(2^w - 2^{w-x+1} + 1) \cdot m}{2^w - 1} \tag{18.2}$$

where $0 \leq x < w$. However, if m is not a multiple of $2^w - 1$, the Equations (18.1) and (18.2) hold true at any time and so need not be evaluated. As for p number of combinations among the above-described n5 number of combinations, BASs can be evaluated using the Equations (18.1) and (18.2) in place of the Equation (14).

A total number, $n_6$, of conditional expressions of BASs that satisfy the Equations (18.1) and (18.2) is $n_6$=1 if w=2 and $n_6$=2 if w≧3.

As one example of BASs satisfying the Equations (18.1) and (18.2), for example, a condition to be met by a BAS $\{0, a1\}$ when w=2 is that the following equation is hold true when m is a multiple of 3.

$$a_1 \neq m/3 \tag{20}$$

Similarly, a condition to be met by a BAS $\{0, a_1, a_2\}$ when w=3 is that the following two equations should hold true simultaneously when m is a multiple of 7.

$$\{a_1, a_2\} \neq \{m/7, 3m/7\} \tag{21.1}$$

$$\{a_1, a_2\} \neq \{m/7, 5m/7\} \tag{21.2}$$

Similarly, a condition to be met by a BAS $\{0, a_1, a_2, a_3\}$ when w=4 is that the following two equations hold true simultaneously when m is a multiple of 15.

$$\{a_1, a_2, a_3\} \neq \{m/15, 3m/15, 7m/15\} \tag{22.1}$$

$$\{a_1, a_2, a_3\} \neq \{m/15, 9m/15, 13m/15\} \tag{22.2}$$

The following will describe two examples in which w+1 number of redundant BASs of $T_0, T_1, \ldots,$ and $T_w$ do not satisfy the Equation (14).

First, the following example is considered in which the Equation (21.1) is not satisfied when $T_0, T_1, T_2,$ and $T_3$ are all redundant in the case of w=3.

$$T_3 = T_2 = T_1 = T_0 = \{0, m/7, 3m/7\} \tag{23}$$

In this case, $T_0, T_1, T_2,$ and $T_3$ are all the same, so that elements of their permutation $U_0, U_1, U_2, U_3$ are all the same. In permutations of the elements of $U_0, U_1, U_2, U_3$, the following exists as one of combinations that satisfy conditions in the case where the above-described BASs are redundant of $b_{y,x} \neq b_{x-1,y}$, that is, all of six conditions of $b_{0,1} \neq b_{0,0}$, $b_{0,2} \neq b_{1,0}$, $b_{1,2} \neq b_{1,1}$, $b_{0,3} \neq b_{2,0}$, $b_{1,3} \neq b_{2,1}$, and $b_{2,3} \neq b_{2,2}$ $$[b_{0,0} b_{1,0} b_{2,0}] = [0 \, m/7 \, 3m/7] \tag{24.1}$$

$$[b_{0,1} b_{1,1} b_{2,1}] = [m/7 \, 3m/7 \, 0] \tag{24.2}$$

$$[b_{0,2} b_{1,2} b_{2,2}] = [0 \, m/7 \, 3m/7] \tag{24.3}$$

$$[b_{0,3} b_{1,3} b_{2,3}] = [0 \, 3m/7 \, m/7] \tag{24.4}$$

By substituting the Equations (24.1) through (24.4) into a left side of the Equation (14) and sequentially evaluating three cases of [ij] of [12], [13], and [23], all of the resultant equations become 0 as follows.

$$b_{1,0} - b_{0,0} + b_{0,1} - b_{1,1} - b_{1,2} - b_{0,2} = m/7 - 0 + m/7 - 3m7 + m/7 - 0 = 0 \tag{25.1}$$

$$b_{2,0} - b_{0,0} + b_{0,1} - b_{2,1} + b_{1,3} - b_{0,3} = 3m/7 - 0 + 3m/7 - 0 + 3m/7 - 0 = 0 (\text{mod } m) \tag{25.2}$$

$$b_{2,0} - b_{1,0} + b_{0,2} - b_{2,2} + b_{2,3} - b_{0,3} = 3m/7 - m7 + 0 - 3m/7 + m/7 - 0 = 0 \tag{25.3}$$

That is, a BAS of the Equation (23) does not satisfy the Equation (14). This indicates that the minimum distance of a QC code with w=3 which has a circulant matrix expressed by a BAS of the Equation (23) as a part of a check matrix is w=1.

Next, the following example is considered in which $T_0, T_1, T_2,$ and $T_3$ are all different in the case where w=3 and m=25.

$$T_0 = \{0, 1, 3\} \tag{26.1}$$

$$T_1 = \{0, 6, 15\} \tag{26.2}$$

$$T_2 = \{0, 5, 17\} \tag{26.3}$$

$$T_3 = \{0, 4, 11\} \tag{26.4}$$

As one of $U_0, U_1, U_2, U_3$ when $U_0=T_0$ is set in Equations (26.1) through (26.4), the following is given.

$$U_0=\{0,1,3\} \quad (27.1)$$

$$U_1=\{0,4,11\} \quad (27.2)$$

$$U_2=\{0,5,17\} \quad (27.3)$$

$$U_3=\{0,6,15\} \quad (27.4)$$

As one of permutations of elements of $U_0, U_1, U_2, U_3$ in the Equations (27.1) through (27.4), the following exists.

$$[b_{0,0}b_{1,0}b_{2,0}]=[013] \quad (28.1)$$

$$[b_{0,1}b_{1,1}b_{2,1}]=[1104] \quad (28.2)$$

$$[b_{0,2}b_{1,2}b_{2,2}]=[1750] \quad (28.3)$$

$$[b_{0,3}b_{1,3}b_{2,3}]]=[0156] \quad (28.4)$$

By substituting the Equations (28.1) through (28.4) into the left side of the Equation (14) and sequentially evaluating three cases of [ij] of [12], [13], and [23], all of the resultant equations become zero as follows.

$$b_{1,0}-b_{0,0}+b_{0,1}-b_{1,1}+b_{1,2}-b_{0,2}=1-0+11-0+5-17=0 \quad (29.1)$$

$$b_{2,0}-b_{0,0}+b_{0,1}-b_{2,1}+b_{1,3}-b_{0,3}=3-0+11-4+15-0=0 \pmod{m} \quad (29.2)$$

$$b_{2,0}-b_{1,0}+b_{0,2}-b_{2,2}+b_{2,3}-b_{0,3}=3-1+17-0+6-0=0 \pmod{25} \quad (29.3)$$

That is, a combination of BASs in accordance with the Equations (26.1) through (26.4) does not satisfy the Equation (14). This indicates that the minimum distance of such a QC code with w=3 and m=25 as to have five circulant matrices expressed by BASs of the Equations (26.1) through (26.4) as a part or an entirety of a check matrix is w+1.

Hereinafter, it is supposed that p number of BASs that express a check matrix of a QC code used in an encoding method according to the embodiments of the present invention satisfy the Equations (9) and (14), that is, a QC code used in embodiments of the present invention is a self-orthogonal code and has a minimum distance of w+2 or larger.

Although it is generally known that a six-cycle is sure to be included in a QC code with w≧3 which is expressed by the Equation (4), I study that the number of six-cycles included in the QC code can be minimized. As for a self-orthogonal QC code which is used in embodiments of the present invention and has a minimum width of w+2 or larger, preferably its check matrix has as few six-cycles as possible in order to reduce a BER at the time of decoding as much as possible. I also study that by utilizing a QC structure of a check matrix, such a check matrix can be designed efficiently for an arbitrary value of w as follows.

Suppose three BASs arbitrarily extracted redundantly from p number of BASs of $S_0, S_1, \ldots,$ and $S_{p-1}$ to be $T_0, T_1,$ and $T_2$. An arbitrary permutation of $T_0, T_1,$ and $T_2$ is supposed to be $U_0, U_1, U_2$ and a permutation of two elements extracted from w number of elements of $U_j$ ($0\leq j\leq 2$) is supposed to be $b_{0,j}, b_{1,j}$. However, if $U_1=U_0, b_{0,1}\neq b_{0,0}$; if $U_1=U_0, b_{0,1}\neq b_{0,0}$; if $U_2=U_0, b_{0,2}\neq b_{1,0}$, and if $U_2=U_1, b_{1,2}\neq b_{1,1}$ and $b_{1,0}>b_{0,0}$.

In this case, to reduce the number of six-cycles included in a check matrix of a QC code, the Equation (14) only when i=1 and j=2 may be sufficiently evaluated. That is, it may be sufficient only to satisfy the following one equation as much as possible for a certain permutation of $U_0, U_1$ and $U_2$ $$b_{1,0}-b_{0,0}+b_{0,1}-b_{1,1}+b_{1,2}-b_{0,2}\neq 0 \pmod{m} \quad (30)$$

However, it is to be noted that if $T_2=T_1=T_0, U_0, U_1, U_2$ which does not satisfy the Equation (30) surely exists.

Further, if w=2, the Equation (30) is the same as the Equation (14), so that it is unnecessary to check them redundantly. In evaluation of the Equation (30), when two elements are extracted from w number of elements about one element of $U_0, U_1, U_2$, for example, $U_0$, its permutations need not to be taken into account in order to avoid redundant evaluation as in the case of the Equation (14).

However, in this case, a method for taking into account a permutation of elements for all BASs by supposing, for example, that $U_0T_0, U_1=T_1$, and $U_2=T_2$ anytime without taking into account the permutations of the BASs themselves temporarily is essentially the same method of the present embodiment.

The maximum value of a total number of times of evaluating the Equation (30) about certain one combination of $T_0, T_1,$ and $T_2$ is the following value of $n_7$.

$$n_7 = \frac{\{(w-1)w\}^3}{2} \quad (31)$$

For example, if w=3, $n_7=108$ and if w=4, $n_7=864$. However, it is only when $T_0, T_1,$ and $T_2$ are all different from one another that the Equation (30) is checked by all $n_7$ number times.

In this case, as described above, if $T_2=T_1=T_0=\{a_0, a_1, a_2\}$, that is, if $T_0, T_1,$ and $T_2$ are composed of one BAS, surely there are a plurality of combinations of $b_{0,j}$ and $b_{1,j}$ that do not satisfy the Equation (30). For example, one of them is the following condition that satisfies $b_{0,1}\neq b_{0,0}; b_{0,2}\neq b_{1,0};$ and $b_{1,2}\neq b_{1,1}$.

$$[b_{0,0},b_{1,0}]=[a_0,a_1] \quad (32.1)$$

$$[b_{0,1},b_{1,1}]=[a_2,a_1] \quad (32.2)$$

$$[b_{0,2},b_{1,2}]=[a_2,a_0] \quad (32.3)$$

If the Equations (32) are substituted into the left side of the Equation (30), 0 is given as follows.

$$b_{1,0}-b_{0,0}+b_{0,1}-b_{1,1}+b_{1,2}-b_{0,2}=a_1-a_0-a_2-a_1+a_0-a_2=0 \quad (33)$$

In such a manner, a fact that an arbitrary $\{a_0, a_1, a_2\}$ does not satisfy the Equation (30) indicates that a six-cycle is included in an arbitrary circulant matrix when w≧3. Except in such a case, the following equation can be used to evaluate the Equation (30) for all elements of $U_0, U_1, U_2$ when $T_2=T_1=T_0=\{a_0, a_1, \ldots, a_{w-1}\}$ where $a_0=0$.

$$a_{i0}-a_{i1}+a_{i2}-a_{i3}+a_{i4}-a_{i5}\neq 0 \pmod{m} \quad (34)$$

where the following:

$1\leq i_0 \leq w$, $0\leq i_1\leq i_0$, $0\leq i_2\leq i_0(i_2\neq i_1)$, $0\leq i_3\leq i_1(i_3\neq i_2)$, $0\leq i_4\leq i_2(i_4\notin\{i_1, i_3\})$, and $0\leq i_5\leq i_3(i_5\notin\{i_2, i_4\})$, are established, so that the Equation (34) needs to be satisfied for all integers if $i_0, i_1, i_3, i_4,$ and $i_5$ in this range. However, if w=2, the Equation (34) is the same as the Equation (20) so that it is unnecessary to check them redundantly.

The maximum value of the total number of times of evaluating the Equation (34) is the following value of $n_8$.

$$n_8 = \frac{(w-3)(w-2)(w-1)w(w+1)(w+2)}{72} + \left\{\frac{(w-1)w}{2}\right\}^2 \quad (35)$$

For example, if w=3, $n_8$=9 and if w=4, $n_8$=46. However, it is only when a BAS thereof satisfies the Equation (34) that the Equation (34) is checked by all n8 number of times.

As many as p number of BASs used in the encoding method according to any embodiments of the present invention need not always to satisfy the Equations (30) and (34) but only need to do them as much as possible. I study that if p number of BASs are designed to surely satisfy the Equation (34) when $T_2=T_1=T_0$ and the Equation (30) otherwise, an achievable maximum value of p is smaller than a case where the Equation (30) or (34) is not satisfied. On the other hand, if p number of BASs are designed to satisfy the Equation (34) only when $T_2=T_1=T_0$, the achievable maximum value of p deteriorate scarcely as far as a value of m is larger to some extent. Therefore, preferably each of the p number of BASs used in the encoding method according to any embodiments of the present invention satisfies the Equation (34) in particular.

Further, I study that however, in this case of w=4, it is constituted of BASs that satisfy the Equations (9), (18), and (34) and p number of BASs that satisfy the Equation (9) surely satisfy the Equation (14). By utilizing this, it is also possible to essentially omit evaluation of the Equation (14).

Such p number of BASs may be designed by any procedures as far as they satisfy the Equations (9) and (14), one of which methods will be described below.

Figures 3, 4:
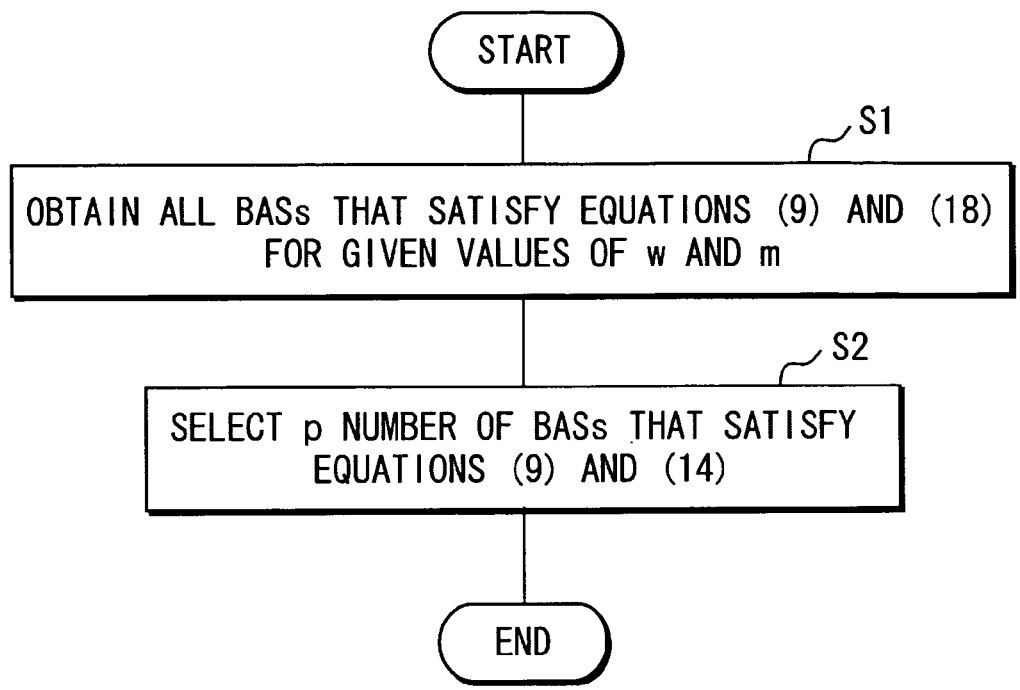
FIG. 3 is a flowchart for showing one example of a procedure for designing a check matrix of a QC code expressed by p number of circulant matrices used in an encoding method to the self-orthogonal QC code according to an embodiment of the present invention.
FIG. 4 is a table for showing results of checking, by a total retrieval method, m, p, a code word length n, the number of BASs Nc that satisfy Equations (9) and (18), which will be described later, the number of combinations No of p number of BASs that satisfy only Equations (9) and (18), which will be also described later, and the number of combinations Ne of p number of BASs that satisfy Equations (9) and (14), which will further be described later, in the case of w=3 and p≦6 according to an algorithm of FIG. 3.

FIG. 3 is one example of a flowchart for showing a procedure for designing a check matrix of a QC code expressed by p number of circulant matrices used in the encoding method according to any embodiments of the present invention. In FIG. 3, first, at step S1, all BASs that satisfy the Equations (9) and (18) are obtained. At the step S1, they may satisfy the Equation (34) simultaneously. Next, at step S2, from the BASs obtained at the step S1, p number of the BASs that satisfy the Equations (9) and (14) are selected. At this step S2, they may satisfy the Equation (30) simultaneously except in the case of $T_2=T_1=T_0$.

It is to be noted that by supposing n=mp in the Equation (2) which express a Steiner bound expression, the following equation is obtained because of m≠0.

$$p \leq \frac{m-1}{w(w-1)} \quad (36)$$

In an algorithm of FIG. 3, whether there is a possibility that the p number of BASs can be obtained can be decided by whether set values of w, m, and p satisfy the Equation (36). However, p=1 is established in a QC code, that is, it is possible to compose a circulant code that has as its ID check matrix a single circulant matrix defined by the BASs only when the number of parity bits of the code is smaller than m. The number of code parity bits can be obtained as a rank of the check matrix when extremely general Gaussian elimination is applied to the check matrix.

If the Equation (36) is satisfied, the number of combinations of the p number of BASs obtained in accordance with the algorithm of FIG. 3 is usually two or more in given w, m. If the values of w, m, and p are small to some extent, it is possible to obtain all of the combinations of the p number of BASs by using a total retrieval method.

FIG. 4 is a table for showing results of checking, by the total retrieval method, m, p, a code word length n, the number of $N_c$ that satisfy the Equations (9) and (18), the number of combinations No of p number of BASs that satisfy only the Equations (9) and (18), and the number of combinations Ne of p number of BASs that satisfy the Equations (9) and (14) in the case of w=3 and p≦6 according to the algorithm of FIG. 3. In this table, $N_o$ is equivalent to the number of self-orthogonal QC codes whose minimum distance is w+1 or larger and $N_e$ is equal to the number of self-orthogonal QC codes whose minimum distance is w+2 or larger and which is used in any embodiment of the present invention.

FIG. 5 is a table for showing results of checking, by the total retrieval method, m, p, n, $N_c$, $N_o$, and $N_e$ as in the case of FIG. 4 when w=4 and p≦4 according to the algorithm of FIG. 3.

In calculation in FIGS. 4 and 5, first, minimum value of m with which the Equation (36) holds true for given values of w and p, that is, m=6p+1 in the case of w=3 and m=12p+1 in the case of w=4 were each checked, as a result of which p was incremented if $N_e$>0 and m was incremented if $N_e$=0.

As can be seen from FIGS. 3, 4, and 5, the method for designing check matrix of QC code, which has been described in the embodiments of the present invention can be applied to arbitrary values of w, m, and p in contrast to the case of a code based on the finite geometry or BIBD as related art.

However, obtaining all combinations of a desired BAS by using the total retrieval method as in the case of FIGS. 4 and 5 necessitates very long calculation time if values of w, m, and p are large to some extent, thus resulting in an impractical attempt. However, practically, only one desired check matrix may be obtained, so that the total retrieval method is not always performed in design of a check matrix but a partial retrieval method can be used instead. As a practical partial retrieval method, such a method may be thought of as a method for combining, for example, a tree retrieval method and a random retrieval method.

The following will compare performance of a type-II finite geometry code, which has been known as self-orthogonal QC code, and that of a code used in the encoding method according to any embodiments of the present invention using a check matrix designed in accordance with the algorithm of FIG. 3.

In a comparative example 1, a (2667, 2547) code with w=3 and m=127 designed on the basis of projective geometry PG (6, $2^1$) in accordance with the above-described literature, "Low Density Parity Check Codes on Finite Geometries: A Rediscovery and New Results," by Y. Kou, S. Lin and M. Fossorier, IEEE Trans. Info. Theory, vol. 47, no. 7, pp. 2711-2735, Nov. 2001 was used. Further, in a comparative example 2, a (5355, 5121) code with w=4 and m=255 designed on the basis of Euclidean geometry EG (4, $2^2$) in accordance with the same above-described literature was used. Both of the comparative examples 1 and 2 use self-orthogonal QC codes with p=21 classified into a type-II finite geometry code in the above-described literature.

It is to be noted that check matrix of codes designed on the basis of finite geometry is expressed using a vector generally referred to as a incidence vector but it can be expressed similar to the case of the embodiments of the present invention also by using the BAS defined in the embodiments of the present invention.

FIG. 6 shows 21 BASs used in the two comparative examples. Combinations of BASs in this FIG. 6 satisfy the Equation (9) but not the Equation (14).

As embodiments 1 and 2, codes having the same values of w, m, and p as those of the comparative examples 1 and 2 were designed in accordance with the algorithm of FIG. 3. These embodiments were both obtained using the partial retrieval method in such a manner that each of the BASs may satisfy the Equations (9), (18), and (34) at step S1 of FIG. 3 and the 21 BASs may satisfy the Equations (9) and (14) at step S2 of FIG. 3. In this case, there is a plurality of codes that can be used in the encoding method according to any embodiments of the present invention for each value of w, so that the present embodiment has selected one of them properly.

FIG. 7 shows the 21 BASs used by the two embodiments of the present invention.

The codes of these embodiments and comparative examples are all included in codes that may be said to be highly useful practically because their code length is realistic and they have a maximum possible value of p that satisfies the Equation (36) for given values of w and m and have a very high encoding rate.

If p number of BASs are selected in such a manner as to provide a maximum possible value of p that satisfies the Equation (36) like the embodiments of the present invention, for example, even when a low encoding rate is acceptable in an actual system, it may simply avoid using any of the selected p number of BASs as a check matrix.

Figures 8, 9:
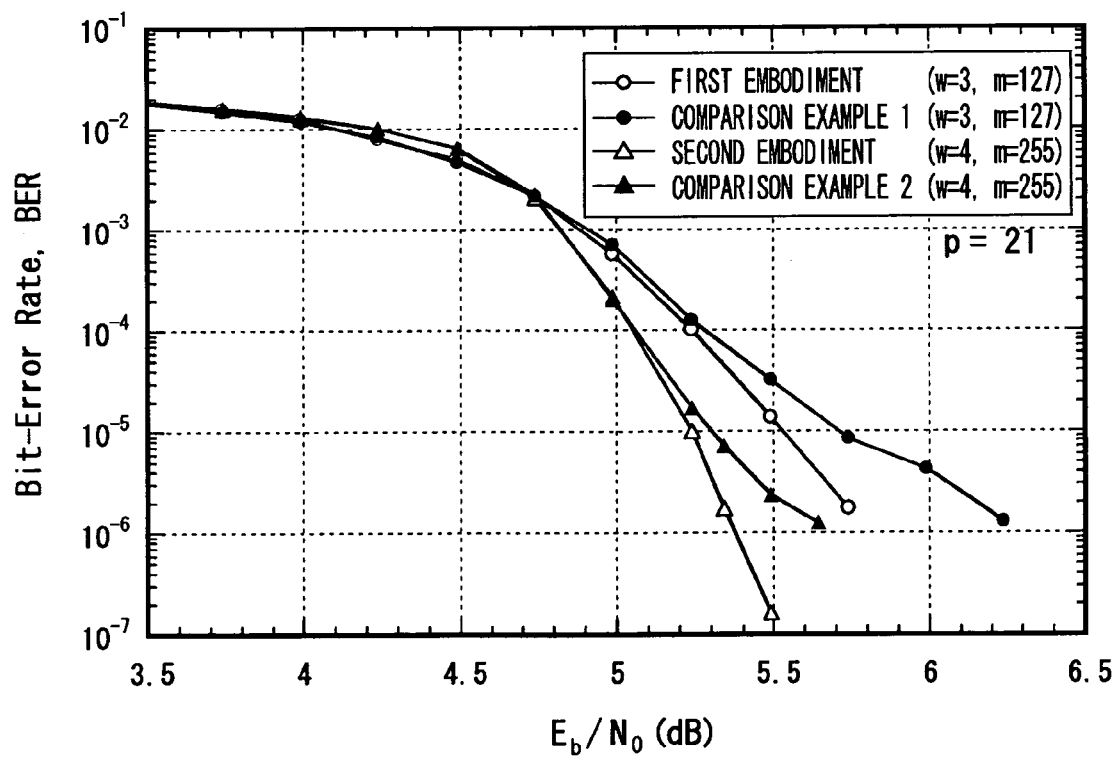
FIG. 8 is a table for summarizing values of code parameters of p=21 QC codes used in the embodiments of the present invention and the comparative example thereof, that is, w, m, n, the number of parity bits (=rank), and an encoding rate R.
FIG. 9 is an explanatory graph of Eb/No dependency of a BER in the embodiments of the present invention and the comparative examples thereof.

FIG. 8 is a table that summarizes values of code parameters of p=21 QC codes used in the embodiments of the present invention and the comparative examples thereof, that is, w, m, n, the number of parity bits (=rank), and an encoding rate R.

As far as I study them, the number of parity bits of a QC code designed in accordance with the algorithm of FIG. 3 is m if w=3 and m−1 if w=4 equally each in the case of p≧2, with which the embodiments of FIG. 8 comply.

Further, I evaluated a BER on the embodiments of the present invention and the comparative examples. I used an encoder for the QC codes shown in FIGS. 6 and 7 to encode random data into a signal sequence having {−1, 1} as an element, added additive white Gaussian noise having dispersion value $\sigma^2$ to it, performed repeated decoding by use of a very typical sum-product decoding method on it, and measured a BER thereof. In this measurement, the number of times of repeating decoding was 20 at the maximum and generated 100 error code words at every measurement point. A signal energy versus noise ratio was defined as $E_b/N_o 5 = -10 \log 10(2R \cdot \sigma^2)$ by using an encoding rate R.

FIG. 9 shows $E_b/N_o$ dependency of a BER in the embodiments of the present invention and the comparative examples thereof. As can be seen from FIG. 9, as compared to the comparative examples, especially at a high value of Eb/No, the embodiments of the present invention exhibits, for example, a decrease in BER, that is, an improvement in error floor. For example, in FIG. 9, as a result of measurement, a BER in the case of Eb/No=5.49 dB was $3.2 \times 10^{-5}$ in comparative example 1, $1.4 \times 10^{-5}$ in the first embodiment, $2.4 \times 10^{-6}$ in the comparative example 2, and $1.6 \times 10^{-7}$ in the second embodiment.

Figure 10:
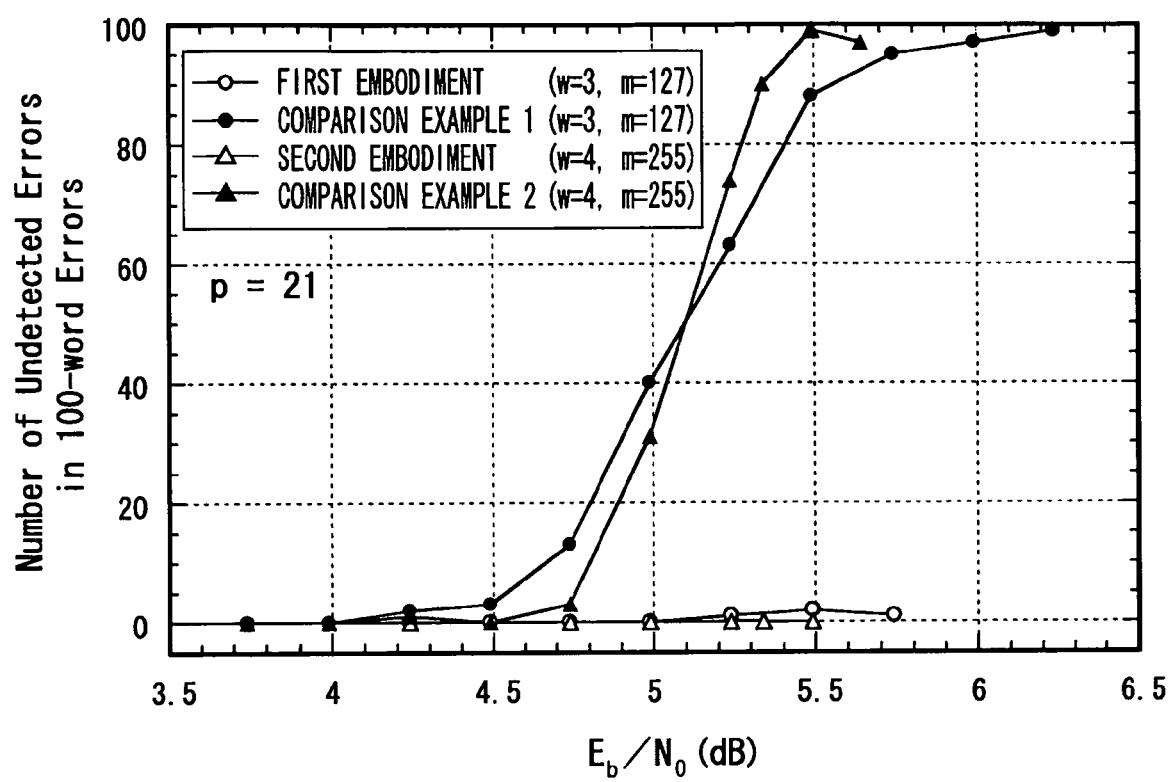
FIG. 10 is an explanatory graph of Eb/No dependency of the number of code words on which an undetected error occurred among 100 code words on which an error occurred in the embodiments of the present invention and the comparative examples thereof.

FIG. 10 shows Eb/No dependency of the number of code words on which an undetected error occurred among 100 code words in which an error occurred during simulation of FIG. 9. An undetected error as used herein refers to such a code word error that a code word on which an error occurred changes into any other code word to thereby fill a check matrix.

As can be seen from FIG. 10, as compared to the comparative examples, especially at a high value of Eb/No, the embodiments of the present invention exhibit a great improvement in undetected error rate. An undetected error rate as used herein is defined as a value obtained by dividing the number of undetected errors given on a vertical axis of FIG. 10 by the number of error code words of 100. For example, in FIG. 10, as a result of measurement, an undetected error rate in the case of $E_b/N_o=5.49$ dB was 99% in comparative example 1, 2% in the first embodiment, 88% in comparative example 2, and 0% in the second embodiment.

If the undetected error rate is improved, it is possible to decide whether the code words after being decoded are erroneous, so that reliabilities for them can be improved by using such a method as sending a request for retransmission of a reproduction signal in an actual system.

In the embodiments of the present invention, an improvement in BER of FIG. 9 and undetected error rate of FIG. 10 is caused by an improvement in minimum distance of codes.

I study that the minimum distance of the self-orthogonal QC code used in the encoding methods according to the embodiments of the present invention is w+2 or larger but, if w is odd-numbered, w+3 or larger.

In view of the above, the minimum distance of codes used in the embodiments and the comparative examples are estimated below. As a result of the simulation of FIG. 9, the number of bit errors that occurred in one code word upon occurrence of an undetected error was four through 22 in the comparative example 1, five to 16 in the comparative example 2, and 6 through 10 in the first embodiment. From this result, it can be seen that the minimum distance of codes is four or less in comparative example 1, five or less in comparative example 2, and six or less in the first embodiment.

However, taking into account that the minimum distance of self-orthogonal codes is certainly w+1 or larger and w is a odd number in the first embodiment of the present invention, it can be determined that the minimum distances of codes are four in comparative example 1, five in comparative example 2, and six in the first embodiment. The second embodiment has encountered no undetected error during the simulation, so that the minimum distance could not be determined. The minimum distance of codes in the second embodiment is at least six.

Although the Equation (30) has not been satisfied in the first embodiment and the second embodiment, one embodiment of the present invention will be enumerated below in which the Equation (30) is also satisfied except in the case of $T_2=T_1=T_0$.

That is, in the third embodiment, when w=3, m=128, and p=4, one of four BASs of $S_0, S_1, S_2, S_3$ that satisfy all of the Equations (9), (14), (30), and (34) is as follows.

$$S_0 = \{0,5,29\} \tag{37.1}$$

$$S_1 = \{0,11,61\} \tag{37.2}$$

$$S_2 = \{0,20,77\} \tag{37.3}$$

$$S_3 = \{0,23,59\} \tag{37.4}$$

To demonstrate that the encoding method according to the embodiments of the present invention can be carried out on an arbitrary value of m, m=128 has been employed in place of m=127 employed in the first and second embodiments. It can be impossible that a code with m=128 is composed by using finite geometry.

As is clear from the above description, the method for designing a check matrix of the self-orthogonal QC code used in the encoding method according to the embodiments of the present invention can be applied to arbitrary values of w, m, and p, and moreover, a code that satisfies this check matrix can improve its BER and undetected error rate simultaneously more than a related self-orthogonal QC code.

According to the embodiments of the present invention, it is possible to improve a BER and an undetected error rate simultaneously. Further, the encoding method according to each of the embodiments of this invention can be applied to an encoder of codes used in a variety of magnetic recording/reproducing apparatuses such as a magnetic disk recording/ reproducing apparatus and a magnetic tape recording/reproducing apparatus, a variety of optical disk apparatuses such as a magneto-optical disk recording/reproducing apparatus, a phase-change optical disk recording/reproducing apparatus, and a playback-dedicated optical disk reproducing apparatus, and a variety of communication apparatuses such as a TV broadcasting system, a portable telephone, and a local area network (LAN) system.

It should be understood by those skilled in the art that various modifications, combinations, sub-combinations and alternations may occur depending on design requirements and other factors insofar as they are within the scope of the appended claims or the equivalents thereof.

What is claimed is:

1. A data encoding and/or decoding method executed by a system controlled by a microprocessor which uses a self-orthogonal Quasi Cyclic (QC) code whose parity check matrix is expressed by at least one circulant matrix, wherein a code sequence is generated which satisfies a check matrix, said check matrix being designed in which a column weight w of each circulant matrix is three or larger and a minimum hamming distance of the code is w+2 or larger, and wherein a period of the QC code is p and a number of rows of the check matrix is m, and one permutation of each element of a j'th ($0 \leq j \leq w$) address set among w+1 number of address sets redundantly extracted from p number of addresses has w as the number of elements, the circulant matrices that constitute the check matrix is $b_0, j, b_1, j, \ldots, b_{w-1}, j$, and a relationship of $b_{j-1,0} - b_{i-1,0} + b_{0,i} - b_{j-1,i} + b_i, j - b_0, j \neq 0$ (mod m) exists where [ij] have values within a range of $2 \leq j \leq w$ and $1 \leq i < j$.

2. The method according to claim 1, wherein p is 2 or more.

3. The method according to claim 2, wherein w is three and the minimum hamming distance of the code is six or larger.

4. The method according claim 2, wherein w is four or more.

5. The method according to claim 1, wherein a number of six-cycles included in each circulant matrix of the parity check matrix is minimized.

6. The method according to claim 5, wherein one of the p number of address sets is $\{a_0, a_1, \ldots, a_{w-1}\}$ where a0=0, a relationship of $a_{i0} - a_{i1} + a_{i2} - a_{i3} + a_{i4} - a_{i5} \neq 0$ (mod m) is established for all of the p number of address sets about all of integers of $i_0, \ldots, i_1, i_2, i_3, i_4$, and $i_5$ within a range given by: $1 \leq i_0 < w$; $0 \leq i_1 < i_0$; $0 \leq i_2 \leq i_0 (i_2 \neq i_1)$; $0 \leq i_3 \leq i_1 (i_3 \neq i_2)$; $0 \leq i_4 \leq i_2 (i_4 \neq \{i_1, i_3\})$; and $0 \leq i_5 \leq i_3 (i_5 \neq \{i_2, i_4\})$.

7. The method according to claim 6, wherein there is no six-cycle over any of two and three circulant matrices arbitrarily extracted from the plurality of circulant matrices that constitute the parity check matrix.

8. The method according to claim 7, wherein when one permutation of each element of the j'th ($0 \leq j \leq 2$) address set among three address sets extracted up-to-twice-redundantly from the p number of addresses is supposed to be $b_0, j, b_1, j, \ldots, b_{w-1}, j$, and if a relationship of $b_{1,0} - b_0 + b_{0,1} - b_1, 1 + b_{1,2} - b_0, 2 \neq 0$ (mod m) is evaluated for all permutations of $b_0, j, b_1, j, \ldots, b_{w-1}, j$, the number of the permutations that do not satisfy the relationship is minimized.

9. The method according to claim 8, wherein the number of the permutations that do not satisfy the relationship of $b_{1,0} - b_{0,0} + b_{0,1} - b_1, 1 + b_{1,2} - b_0, 2 \neq 0$ (mod m) is zero.

10. The method according to claim 6, wherein the number of the six-cycles over any of two and three circulant matrices arbitrarily extracted from the plurality of circulant matrices that constitute the parity check matrix is minimized for given values of w, m, and p.

11. The method according to claim 10, wherein when one permutation of each element of the j'th ($0 \leq j \leq 2$) address set among three address sets extracted up-to-twice-redundantly from the p number of addresses is supposed to be $b_0, j, b_1, j, \ldots, b_{w-1}, j$ and if a relationship of $b_{1,0} - b_{0,0} + b_{0,1} - b_1, 1 + b_{1,2} - b_0, 2 \neq 0$ (mod m) is evaluated for all permutations of $b_0, j, b_1, j, \ldots, b_{w-1}, j$, the number of the permutations that do not satisfy the relationship is minimized.

12. The method according to claim 11, wherein the number of the permutations that do not satisfy the relationship of $b_{1,0} - b_{0,0} + b_{0,1} - b_1, 1 + b_{1,2} - b_0, 2 \neq 0$ (mod m) is zero.

* * * * *